United States Patent [19]

Fournes et al.

[11] Patent Number: 4,655,383
[45] Date of Patent: Apr. 7, 1987

[54] METHOD OF REPAIRING HEAT RESISTANT ALLOY PARTS

[75] Inventors: Jean-Paul Fournes, Dannemois; Jacques Lesgourgues, Corbeil; Robert Martinou, Bry sur Marne, all of France

[73] Assignee: Societe Nationale d'Etude et de Construction de Moteurs d'Aviation, France

[21] Appl. No.: 733,185

[22] Filed: May 13, 1985

[30] Foreign Application Priority Data

May 17, 1984 [FR] France ................................ 84 07648

[51] Int. Cl.$^4$ ............................................ B23K 25/00
[52] U.S. Cl. .................................... 228/119; 228/221; 228/206
[58] Field of Search ............... 228/119, 219, 220, 221, 228/225, 226, 238, 205, 206, 263.13; 134/3, 28, 41

[56] References Cited

U.S. PATENT DOCUMENTS

| | | | |
|---|---|---|---|
| 3,291,640 | 12/1966 | Livingston | 134/28 |
| 3,849,851 | 11/1974 | Kaltz | 228/205 |
| 4,008,844 | 2/1977 | Duvall et al. | 228/119 |
| 4,050,133 | 9/1977 | Cretella et al. | 29/156.8 B |
| 4,078,977 | 3/1978 | Fountain | 228/119 |
| 4,098,450 | 7/1978 | Keller et al. | 228/119 |
| 4,285,459 | 8/1981 | Baladjanian et al. | |
| 4,324,594 | 4/1982 | Chasteen | 228/206 |
| 4,381,944 | 5/1983 | Smith et al. | 228/119 |
| 4,493,451 | 1/1985 | Clark | 228/238 |

FOREIGN PATENT DOCUMENTS

| | | |
|---|---|---|
| 0024142 | 2/1981 | European Pat. Off. . |
| 0095607 | 9/1983 | European Pat. Off. . |
| 7539492 | 12/1975 | France . |
| 2383750 | 3/1978 | France . |
| 2511908 | 8/1981 | France . |
| 1454217 | 11/1976 | United Kingdom . |

OTHER PUBLICATIONS

*Turbine Stator Parts Repair by Diffusion Brazing*, by Honnorat & Lesgourgues, SNECMA 1981.
Chemical Abstract 88: 40722k.

*Primary Examiner*—M. Jordan
*Attorney, Agent, or Firm*—Bacon & Thomas

[57] ABSTRACT

The instant invention describes a method of repairing heat-resistant alloy parts which have been cracked or otherwise damaged due to exposure of combustion gases from a turbojet engine. The method includes chemically cleaning the surface of the part to remove the layer of contaminants and subjecting the part to a thermochemical treatment to thoroughly clean the cracks and other narrow, damaged areas. A diffusion brazing process is then utilized to fill the cracks or damaged areas.

11 Claims, No Drawings

4,655,383

METHOD OF REPAIRING HEAT RESISTANT ALLOY PARTS

RELATED APPLICATIONS

This application is related to U.S. Ser. No. 707,965 filed on Mar. 4, 1985, in the name of Martinou et al and U.S. Ser. No. 708,103 filed on Mar. 5, 1985, to Lesgourges which is a continuation of U.S. Ser. No. 409,285 filed on Aug. 18, 1982, now abandoned.

FIELD OF THE INVENTION

The invention relates to a method for repairing cracked or damaged parts made of a heat-resistant nickel, cobalt or iron-based alloy, specifically those parts of a turbojet engine which have been exposed to high-temperature combustion gases generated by the engine.

BRIEF DESCRIPTION OF THE PRIOR ART

U.S. patent application Ser. No. 708,103 to Lesgourges (corresponding to Lesgourges French Pat. No. 2,511,908) describes a method for diffusion brazing heat-resistant alloy parts which may be fabricated from superalloys. The process described in this application may be used to repair cracked or damaged parts such as a precision-cast turbine vane made of a cobalt-based alloy which has been damaged by thermal-fatigue cracks. In this application, the smallest cracks are filled with a filler metal in the form of a pre-alloyed powder mixed with a volatile binder. The base powder of this alloy is nickel-chromium and the alloy contains a flux, such as boron, in a proportion sufficient to render it more easily meltable than the alloy of the part to be repaired. The flux can also diffuse into the metal of the part. The filler metal is melted by heating the part to a temperature of approximately 1,200° C. for fifteen minutes in a vacuum.

On parts which have larger gaps such that they are not capable of treatment by merely applying the filler, a facing material of a cobalt-based alloy and a filler metal based on nickel-cobalt and which contains silicon and boron fluxes is placed over the damaged area. Again, the filler metal is melted by heating the part for approximately fifteen minutes at 1,200° C. in a vacuum. Finally, the part is diffusion-treated for approximately four hours in a vacuum at approximately 1,200° C.

In order for this method to be effective, it is assumed that the parts were thoroughly cleaned and processed for overhaul. It is also necessary to clean the surface of the parts to be repaired, in particular the cracks in the part.

In actuality, the damaged parts are usually covered with a contaminated layer of chemical compounds, in particular complex oxides and oxysulfides of aluminum, titanium and chromium which are the alloy components of the part. Unless these contaminated layers are eliminated, they will cause poor wetting of the walls of the cracks by the molten filler material and, therefore, will not allow this filler metal to completely plug the cracks. These complex compound deposits are highly stable and tenacious and are extremely difficult to remove from the part.

It is known to clean such superalloy parts before brazing by subjecting them to a thermochemical treatment. Such treatments consist of placing the part in a heated enclosure through which hydrogen flows in the presence of a halogen compound, for instance ammonium fluroide. This releases fluorine ions which react with the surface oxides to form metal fluorides which are gaseous at the temperature of reaction so as to remove them from the part. Although this method is generally effective, it suffers from several drawbacks: (1) it has been found that this method does not decompose all of the surface layers, some of which, such as oxysulfides, are resistant to this treatment and negate any later repair processes; (2) this treatment cannot be unduly extended in order to eliminate these contaminants since there would be degradation of the substrate by the change in surface composition. Some elements, such as titanium, tungsten, aluminum, are eliminated first and aged parts are particularly vulnerable since their surface composition has been changed by their long exposure to the hot combustion exhaust gases; (3) an extended thermochemical treatment results in a more pronounced inter-granular corrosion, again depending upon the age of the parts involved; and (4) the treatment cannot be applied to some components, such as combustion chambers, which consist of a plurality of sections joined by brazing since the fluorinated atmosphere attacks the molten brazing material.

U.S. Pat. No. 4,285,459 describes a method for repairing superalloy parts wherein each crack is machined by a tool to a depth sufficient to assure the removal of the undesired deposits and to sufficiently open the crack for further processing. This method is applicable only if the number of cracks in a part is rather small, since the method is costly and difficult to carry out.

U.S. patent application Ser. No. 707,965 to Martinou et al discloses a chemical pickling bath to de-oxysulfurize cracked parts which must be repaired by diffusion-brazing. The results of this method have proven to be highly satisfactory with respect to the surface quality outside the cracks. Although this method allows treating all known compounds without affecting the quality of the material, the removal of the contaminants from deep and narrow cracks is somewhat insufficient due to the rapid saturation of the liquid inside the cracks. These cracks form a confined space which have very restricted exchange with the exterior of the part and local bath replenishment is extremely limited.

SUMMARY OF THE INVENTION

The invention relates to a method for repairing heat-resistant alloy parts which allows even deep and narrow cracks in the part to be cleaned sufficiently to allow the diffusion-brazing repair process. The method involves the use of a chemical cleaning treatment combined with a thermochemical treatment to prepare the cracked or damaged parts prior to undergoing the diffusion-brazing process. Following the initial chemical treatment, the parts are cleaned at the surface and in larger cracks or damaged areas. The part is then subjected to a thermochemical treatment which is applied to complete the cleaning of the cracks. The initial cleaning allows the reduction of time to which the part is subjected to the thermochemical treatment and thereby eliminates any possibility of degrading the metal of the part.

DETAILED DESCRIPTION OF THE PREFERRED EMBODIMENT

The method according to the invention comprises a first stage of chemically cleaning the surface of the part by immersing it consecutively into different baths with a rinsing bath between the different immersions. The first stage includes a de-scaling by immersing the part in acid or alkaline baths which are known under the names of Turco 4181 or Ardrox 1871. This de-scaling is followed by conditioning the more resistant oxides in an alkaline permanganate bath, such as Turco 4338C, or a bath of molten soda. This conditioning converts the oxides into soluble elements which can be removed by an acid bath into which the parts are next immersed.

In the typical de-oxidation ranges, this acid bath is based on nitric and hydrofluoric acids. However, it appears that this acid bath causes substantial intergranular corrosion of the metal of the part, or is ineffective with respect to particularly tenacious oxysulfide deposits. Thus, the de-oxidation acid bath employed in this invention is an aqueous solution of hydrochloric acid, nitric acid, acetic acid and phosphoric acid, and further contains a ferric salt. The composition of this bath as set forth in Ser. No. 707,965, is effective when the various components are mixed in the concentrations shown below:

water: 180+/−50 ml/1
ferric sulfate: 160+/−45 g/1
hydrochloric acid: 460+/−100 ml/1
nitric acid: 160+/−40 ml/1
acetic acid: 115+/−20 ml/1
phosphoric acid: 85+/−15 ml/1.

It is possible to alter the mixture known above and retain the properties of the solution by replacing the ferric sulfate with ferric chloride associated with sulfuric acid. The part is immersed in such an acid bath between three and ten minutes with the bath temperature between 20° and 35° C. Depending upon the thickness of the contaminant deposit, the cycle of conditioning the oxide and of chemical pickling is repeated several times. In order to enhance the action of the baths, it is possible to blast the surface of the part with metal granules to rupture the oxide layer. Also, the rinsing efficiency of the rinsing baths may be increased by applying ultrasonic agitation to the rinsing baths.

Once the parts have been surface cleaned, they are thermochemically treated to effectively clean the deep and narrow cracks. This is accomplished by placing the part in a semi-permeable enclosure located within a hydrogen-controlled atmosphere oven. The part is placed in the enclosure with reaction components which contains a material releasing fluroine ions, such as granulated chromium and ammonium fluoride. At the reaction temperature, the oxides on the part are transformed into gaseous metal fluorides which are carried away by the hydrogen gas flow. The oven is heated to a temperature not greater than 1,100° C. and preferably to a temperature of approximately 1,050° C. Due to the initial chemical preparation, the thermochemical treatment is preferably carried out for a duration of no greater than 30 minutes and preferably 15 minutes.

After the part has been thermochemically cleaned, a filler metal consisting of a nickel or cobalt based alloy with a filler element (such as boron and/or silicon) is prepared in the form of a powder mixed with a volatile binder or in the form of a thin strip sheet less than 100 microns thick. The alloy may be nickel-chromium-boron or nickel-cobalt-silicon-boron. The powder is deposited on the visible defects in the part and the strip sheets are placed on surfaces likely to have invisible defects. In the case where silicon is used, the strip sheet technique offers the additional advantage of depositing on the part surface an element which improves its oxidation resistance.

The part is then subjected to a thermal cycle of simple brazing in the oven under a vacuum atmosphere. The temperature is raised in steps to the brazing temperature and is kept at the brazing temperature for approximately 15 minutes before the parts are cooled. The purpose of this stage is to plug the finest cracks of which the opening does not exceed 50–100 microns. The brazing-temperature level allows the filler material to melt and wet the small defects. However, by restricting its duration to approximately 15 minutes, the metallurgical diffusion is not total.

Finally, a mixture of powders having an overall composition close to a conventional superalloy is spread over the entire surface of the physical defects. This mixture consists of at least two powders: a first, or base, powder; and a second, filler, powder containing at least nickel or cobalt and which includes at least one filler element which reduces the melting point lower than the alloy of the part and the base powder. The part is then subjected to a thermal cycle similar to that of the previous operation in order to achieve a thorough alloy and to make this alloy wet the part surface.

The part is subjected to a thermal diffusion treatment wherein it is held at the brazing temperature under a vacuum atmosphere for a time more than four hours but less than sixteen hours. This treatment allows complete and mutual diffusion of the elements and the homogenization of the bonding zone whose quality is approximately the same as that of the base material.

This method has been implemented with regard to repairing the sidewalls of a combustion chamber made of a cobalt based alloy KCN2 2W (commercially known as HA188). The preparation in this particular instance consisted of chemical cleaning in two cycles, each comprising the immersion in an alkaline and then in an acid de-scaling bath, an alkaline conditioning bath of the oxide by means of a permanganate, and a bath in the aqueous acid solution having a ferric sulphate with the composition noted above. In the acid plus ferric sulphate bath, the immersion time was restricted to seven minutes. Furthermore, each cycle included a shot-blasting of the part with a metal powder of 60–120 micron grains at a pressure of 6 bars. Each rinsing bath and also the final polishing bath included ultrasonic agitation.

The cleaning of the part was concluded by a thermochemical treatment in a fluorinated atmosphere at 1,050° C. for fifteen minutes.

After the parts had been cleaned in this manner, the filler metal, and Ni-Co-Si-B alloy in the form of a powder mixed with an organic binder was deposited at the tips of the gaps along the coarsest defects. The metal filler was also deposited in the form of a fine strip sheet 40 microns thick on all of the edges of the defects. The first thermal brazing cycle was applied in the oven under a vacuum for fifteen minutes at 1,200° C. To plug all of the defects, the mixture consisting of a powder based on a nickel alloy and a filler powder of an Ni-Co-Si-B alloy was deposited. The second thermal brazing cycle was again applied under a vacuum atmosphere for fifteen minutes at 1,200° C. Finally, following verification that the plugging cycle had been properly performed, the final diffusion cycle was implemented for eight hours at 1,160° C. Examination of the part after this complete cycle showed that the liquid metals had properly wetted the part substrate and that all of the defects had been plugged.

The foregoing description is provided for illustrative purposes only and should not be construed as in any way limiting this invention, the scope of which is defined solely by the appended claims.

What is claimed is:

1. A method for repairing cracked or damaged parts made of a heat resistant nickel, cobalt based alloy having a surface with a contaminated layer of chemical compounds comprising the steps of:
   (a) chemically cleaning the surface of the part, said chemical cleaning comprising the steps of:
      (i) de-scaling the part;
      (ii) rinsing in water bath;
      (iii) immersing the part in an alkaline bath to convert oxides on the part into soluble elements;
      (iv) rinsing in water bath;
      (v) immersing the part in acid pickling bath comprising an aqueous solution of hydrochloric acid, nitric acid, acetic acid, phosphoric acid and a ferric salt to remove the converted oxides; and
      (vi) rinsing in water bath;
   (b) thermochemically treating the part to clean the cracks and damaged areas of the part by placing it in a semi-permeable enclosure in a hydrogen controlled atmosphere oven and heating it with reaction components to transform the oxides remaining on the part;
   (c) depositing a filler metal on the surface and the visible damaged areas of the part, the filler metal being an alloy having at least nickel or cobalt and including a filler element to render the filler metal easily meltable and capable of diffusing into the part;
   (d) subjecting the part to a first thermal brazing cycle to fuse the metal filler and wet the surfaces to which it is applied;
   (e) depositing a mixture of a base powder and a filler powder on the surface of the part having visible defects, the base powder containing substantially no filler element and the filler powder containing at least nickel or cobalt with a filler element to render it more easily meltable than the alloy of the part and the base powder;
   (f) subjecting the part to a second thermal brazing cycle to thoroughly alloy the powder mixture and to wet the surface to which it is applied; and,
   (g) subjecting the part to thermal diffusion treatment for a time and at a temperature to insure homogenization of the repaired zone.

2. The method according to claim 1 wherein the iron salt is ferric sulfate.

3. The method according to claim 1 wherein the step of de-scaling the part comprises immersing the part in an acid bath.

4. The method according to claim 1 wherein the step of de-scaling the part comprises immersing the part in an alkaline bath.

5. The method according to claim 1 wherein the alkaline bath is an alkaline permanganate bath.

6. The method according to claim 1 wherein the reaction components of the thermochemical treating of the part are granulated chromium and ammonium fluoride which, when heated in the hydrogen controlled atmosphere release fluorine ions to transform the oxides into gaseous metal fluorides.

7. The method according to claim 6 wherein the oven is heated to a temperature not greater than 1,100° C.

8. The method according to claim 7 wherein the oven is heated to a temperature of approximately 1,050° C.

9. The method according to claim 6 wherein the thermochemical treatment has a duration of not greater than 30 minutes.

10. The method according to claim 9 wherein the thermochemical treatment has a duration of approximately 15 minutes.

11. The method according to claim 1 comprising the additional step of applying ultrasonic agitation to the rinsing bath.

* * * * *